(12) United States Patent
Gutt et al.

(10) Patent No.: US 7,723,158 B2
(45) Date of Patent: May 25, 2010

(54) METHOD FOR PRODUCING AND CLEANING SURFACE-MOUNTABLE BASES WITH EXTERNAL CONTACTS

(75) Inventors: Thomas Gutt, Taufkirchen (DE); Sokratis Sgouridis, Annenheim (AU)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/552,754

(22) Filed: Oct. 25, 2006

(65) Prior Publication Data

US 2007/0111527 A1 May 17, 2007

(30) Foreign Application Priority Data

Oct. 25, 2005 (DE) .................. 10 2005 051 330

(51) Int. Cl.
H01L 21/00 (2006.01)
H01L 21/44 (2006.01)
(52) U.S. Cl. .............. 438/107; 438/613; 438/661; 438/663; 257/E23.026; 257/E21.508
(58) Field of Classification Search ......... 438/107–108, 438/115, 612–617, 660, 663; 257/E23.026, 257/E21.508
See application file for complete search history.

(56) References Cited

U.S. PATENT DOCUMENTS

| 4,934,581 | A | * | 6/1990 | Ibe et al. ................... 228/190 |
| 5,665,639 | A | * | 9/1997 | Seppala et al. ............. 438/15 |
| 5,773,359 | A | | 6/1998 | Mitchell et al. ............ 438/614 |
| 2002/0000646 | A1 | * | 1/2002 | Gooch et al. ................ 257/666 |
| 2002/0009869 | A1 | * | 1/2002 | Cotte et al. ................. 438/612 |
| 2002/0076909 | A1 | * | 6/2002 | Matsuki et al. ............. 438/612 |
| 2003/0173523 | A1 | | 9/2003 | Vuorela ................. 250/370.13 |
| 2005/0241731 | A1 | * | 11/2005 | Duchesne et al. ............ 148/25 |
| 2005/0277279 | A1 | * | 12/2005 | Luo et al. .................. 438/614 |
| 2006/0030139 | A1 | * | 2/2006 | Mis et al. ................... 438/612 |

FOREIGN PATENT DOCUMENTS

DE 10127889 A1 12/2002

* cited by examiner

Primary Examiner—Hsien-ming Lee
Assistant Examiner—Kevin Parendo
(74) Attorney, Agent, or Firm—Eschweller & Associates, LLC

(57) ABSTRACT

In a method for producing bases with external contacts for surface mounting on circuit mounts, bases with external contacts are electrodeposited on semiconductor wafers or semiconductor chips. Subsequently, electrodeposited bases with external contacts are heat treated on the semiconductor wafers or the semiconductor chips at temperatures below the melting temperature of the deposited contact base material. Thereafter, a so-called RTP process is carried out in the form of a high-temperature interval in which the melting temperature is reached. Subsequently, the surfaces of the bases with external contacts are wet etched, the overall method being terminated by a cooling and drying operation. The bases with external contacts thus produced can be reliably surface mounted on circuit mounts.

37 Claims, 2 Drawing Sheets

METHOD FOR PRODUCING AND CLEANING SURFACE-MOUNTABLE BASES WITH EXTERNAL CONTACTS

PRIORITY

Figure 1:
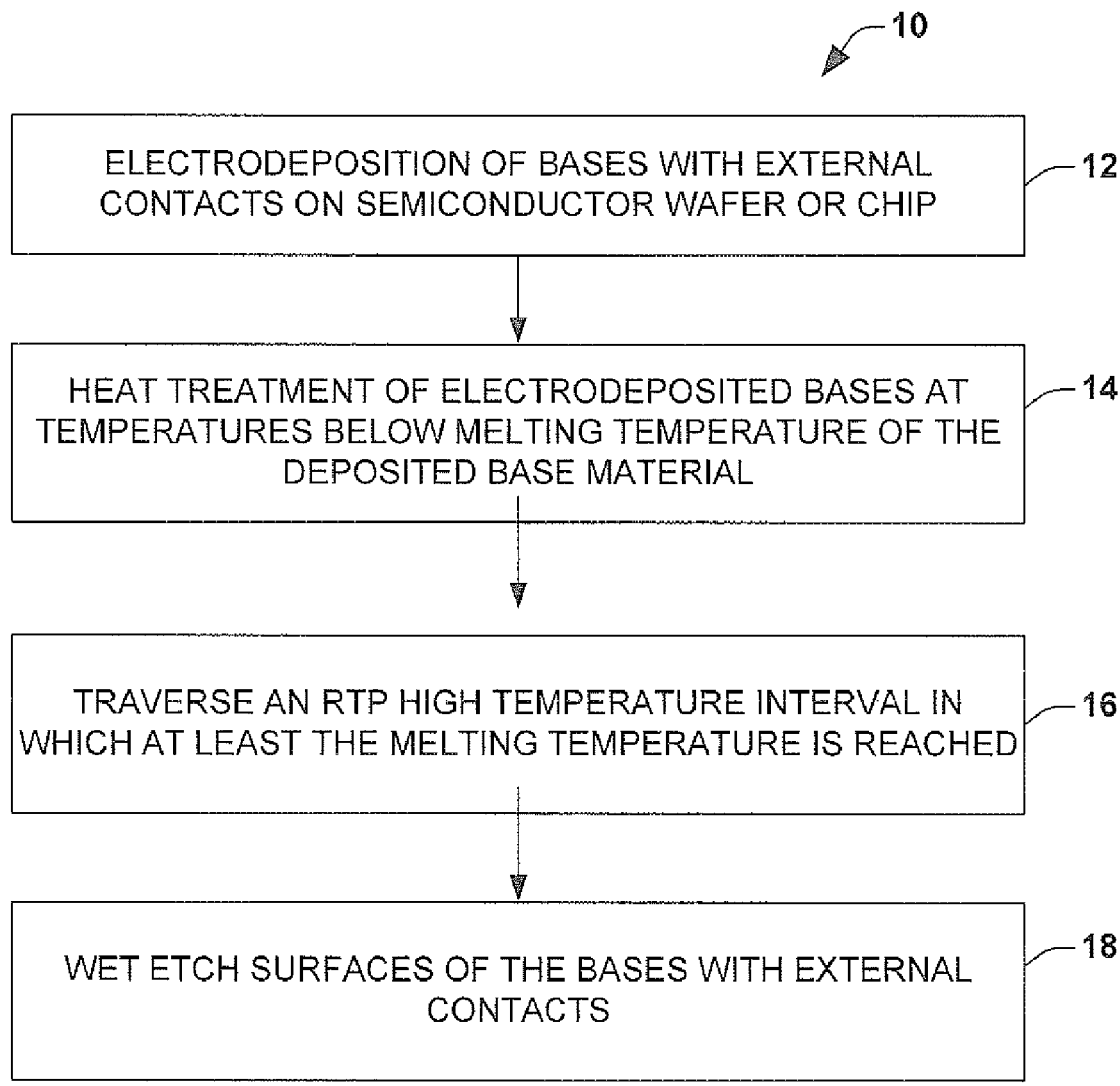

This application claims priority from German Patent Application No. DE 10 2005 051 330.1, which was filed on Oct. 25, 2005, and is incorporated herein by reference in its entirety.

TECHNICAL FIELD

The invention relates to a method for producing and cleaning bases with external contacts for surface mounting on circuit mounts. To this end, the bases with external contacts are electrodeposited on contact surfaces of semiconductor wafers or semiconductor chips and serve as flipchip contacts for surface mounting on circuit mounts.

BACKGROUND

Conventional flipchip contacts can be surface mounted in a relatively uncritical fashion as long as they are soldered as soldering globules on contact surfaces of semiconductor chips. Reliability problems do not occur until electrodeposited bases with external contacts are used as flipchip contacts. Even pretreatment by wet etching does not yield the desired improvement in the surface mounting reliability, as achieved with soldered-on flipchip contacts as soldering globules. Rather, it is to be stated that wet etching of distinct bases with external contacts increases the roughness of the base surface, the result being a jagged base surface.

Nevertheless, the need exists to replace the conventional soldering globules for flipchip contacts by electrodeposited bases with external contacts, since the operation of mounting soldering globules on semiconductor chips or on semiconductor wafers is a critical process that, solely by the distribution of the many soldering globules on a semiconductor wafer in predetermined positions, specifically the contact surfaces of the semiconductor wafer, is a time-consuming and critical one, whereas the electrodeposition of bases with external contacts on a semiconductor wafer can be carried out in a time-saving fashion by means of appropriate masking techniques for a multiplicity of bases with external contacts and, at the same time, for a multiplicity of semiconductor wafers, by contrast with soldering globules for which each semiconductor wafer on each semiconductor chip has to be provided individually with soldering globules. This requires complicated distribution and adjustment techniques for the flipchip contact soldering globules.

The reliability problems in electrodeposited bases with external contacts are to be ascribed in part to contaminants in the electrodeposited materials. The problems also are based in part on hydrogen spraying of the metal mixtures of the electrodeposited bases with external contacts. Such defects and contaminations which depress the surface mounting reliability of contact bases, can be caused by the most varied additives that are added to the metal salts of an electrodeposition bath in order to increase the wettability or the flowability of the electrodeposition bath. Thus, brighteners, wetting agents, cyanides or other organic substances such as citric acid, are added, for example in order to minimize precipitation reaction products. Such problem substances are not included in soldering globules since they arise from melting in a spraying or dripping process and do not come into contact with liquids such as electrodeposition baths.

SUMMARY

In one embodiment, a method for producing and cleaning bases with external contacts for surface mounting on circuit mounts, may comprise the steps of electrodeposition of bases with external contacts on semiconductor wafers or semiconductor chips; heat treatment of electrodeposited bases with external contacts of the semiconductor wafers or the semiconductor chips at temperatures below the melting temperature of the deposited contact base material; traversing an RTP high-temperature interval in the case of which at least the melting temperature is reached, and wet etching the surfaces of the bases with external contacts.

DETAILED DESCRIPTION

According to an embodiment, the method for producing and cleaning bases with external contacts for surface mounting on circuit mounts may have the following method steps. Firstly, bases with external contacts are electrodeposited on semiconductor wafers or semiconductor chips. Subsequently, the electrodeposited bases with external contacts of the semiconductor wafers or the semiconductor chips are heat treated at temperatures below the melting temperature of the deposited contact base material. Thereafter, an RTP (rapid temperature process) is carried out in the form of a high-temperature interval and in this case at least the melting temperature of the contact base material is reached. Thereafter, the surfaces of the bases with external contacts are subjected to wet etching. A concluding rinsing and drying of the bases with external contacts terminates the method of production and cleaning. The method can also be iterated to attain particularly good results.

One advantage of this method is that after the production and cleaning of the bases with external contacts the latter exhibit a clean surface in no way subordinate to the surfaces of soldering globules. The instances of jaggedness and surface roughness have otherwise occurred during wet etching of bases with external contacts are also overcome. The reliability of the surface mounting of bases with external contacts produced and cleaned in such a way is substantially improved such that failure to make contact during surface mounting no longer occurs.

In another embodiment, a method for producing surface-mountable semiconductor chips for circuit mounts, may have the following method steps. Firstly, a semiconductor wafer is produced with semiconductor chip component positions arranged in rows and columns, the semiconductor component positions having metal contact surfaces that are operationally connected to semiconductor element structures of the semiconductor component positions via surface-protected conductor tracks. An electrically conductive seed layer is now applied to the surface of the semiconductor wafer with metal contact surfaces. This electrically conductive seed layer is covered with an insulating protective layer while exposing the contact surface regions.

A selective electrodeposition of bases with external contacts is now performed on the seed layer in the freely accessible contact surface regions. The protective layer is removed thereafter. After the removal of the protective layer, it is possible to perform heat treatment of the electrodeposited bases with external contacts of the semiconductor wafer at temperatures below the melting temperature of the deposited contact base material. Finally, after the heat treatment step an RTP process in which the melting temperature is reached is carried out in the form of a high-temperature interval. In conclusion, the surfaces of the bases with external contacts are wet etched together with the removal of the still remaining seed layer residues.

This method has the advantage over the method of soldering globules in accordance with the prior art that any desired number of wafers can be suspended in an electrodeposition bath after the topside of the semiconductor wafer has been prepared in such a way that all the contact surfaces on the top side are connected to the cathode of the electrodeposition bath on the one hand, and that, however, the deposition is placed only in the freely accessible contact surface regions, on the other hand.

It is thereby possible to produce a multiplicity of bases with external contacts as flipchip contacts for surface mounting of semiconductor chips. This avoids the time consuming adjustment and alignment of mounts, which have corresponding soldering globules, from the topside of a semiconductor wafer or semiconductor chip. Moreover, the fabrication steps are compatible with the techniques previously applied in semiconductor technology. The disadvantages that attend the electrodeposited material in the form of bases with external contacts can then be overcome by the inventive method steps of heat treatment and the high temperature interval and subsequent wet etching. To this end, it is possible in one embodiment for the semiconductor wafer to be separated before wet etching into individual semiconductor chips with heat treated bases with external contacts. In one embodiment, wet etching is then performed, for example, in an automatic drum system or automatic spraying system.

In a further embodiment of the production of bases with external contacts, even before the heat treatment the semiconductor wafer can be separated into individual semiconductor chips with bases with external contacts. In general, singulation before wet etching and/or also before the heat treatment can be more time consuming than when the entire semiconductor wafer with bases with external contacts is both heat treated and also wet etched later after the high temperature interval.

In one embodiment, the heat treatment temperature $T_T$ below the melting temperature $T_S$ is preferably in the range of $$(T_S - 50°\ C.) \leq T_T \leq (T_S - 5°\ C.)$$

It is ensured in this temperature range for heat treatment below the melting temperature $T_S$ that volatile substances can escape from the structure of the material of the bases with external contacts.

In one embodiment, i the case of the high temperature short interval, the bases with external contacts can be heated in an RTP process to peak temperatures $T_H$ that are at $$(T_S + 5°\ C.) \leq T_H \leq (T_S + 50°\ C.)$$

relative to the melting temperature $T_S$. This ensures that at least the melting temperature $T_S$ of the bases with external contacts is reached and that there now takes place in the liquid phase a surface segregation of solid contaminants and inclusions in the bases with external contacts, and that the solid contaminants and inclusions agglomerate on the surfaces. The material of the bases with external contacts, which is thus heat treated and briefly fused now has properties that enable a reliable surface mounting of the semiconductor chips on appropriate circuit mounts.

In one embodiment, the diffusing out of volatile substances during the heat treatment step may require a minimum time that, in the case of the above specified temperature interval, is between $$0.5\ h \leq t_D \leq 5.0\ h,$$ where $t_D$ is the heat treatment period, preferably at $$1.5\ h \leq t_D \leq 2.5\ h.$$

By contrast, the high temperature interval is substantially shorter since a surface segregation of solid contaminants or inclusions from the interior of the molten bases with external contacts can take place within seconds or a few minutes. Consequently, in one embodiment, a high temperature interval can be set for a period $t_H$ of $$10x \leq t_H \leq 300\ s,$$ preferably $$20\ s \leq t_H \leq 50\ s.$$

In one embodiment, the wet etching can be carried out with the most varied solvents and diluted acids and/or lyes. In one embodiment, wet etching of the surfaces of the bases with external contacts is preferably carried out with 1% hydrofluoric acid. In one embodiment, for wet etching of the surfaces of the bases with external contacts 1% sulfuric acid may also be used. The 1% hydrofluoric acid removes or reduces oxides that agglomerate or are formed on the surfaces. For example, the sulfuric acid burns by oxidation the carbon residues of organic compounds on the surface of the bases with external contacts. In one embodiment, it can therefore be advantageous to use a mixture of 1% hydrofluoric acid and 1% sulfuric acid for wet etching.

In one embodiment, a further advantage for electrodeposited bases with external contacts consists in the possibility of depositing any desired material combinations in the electrodeposition bath, this being done by simultaneously adding salts of various metals into the electrodeposition bath. Thus, for example, in one embodiment, an SnAg solder mixture can be deposited as base with external contacts on the contact surface regions of the semiconductor wafer by adding a tin salt and a silver salt. Such a solder mixture has the advantage that after a short time interval a material of the bases with external contacts is available that, on the one hand, is free from lead and, on the other hand, has a somewhat increased melting point by comparison with zinc-lead solders and, for example, forms high temperature resistant intermetallic phases with copper-containing contact connecting surfaces of a circuit mount.

In one embodiment, a further material for the bases with external contacts consists of an SnAgCu solder mixture that can be deposited in the electrodeposition bath by adding a tin salt, a silver salt and a copper salt. This solder mixture has the advantage that the bases with external contacts can be soldered reliably directly on to the copper-clad circuit mounts and that it is possible in this case to form high temperature resistant intermetallic phases such as $Cu_3Sn$ or $Cu_6Sn_5$.

In one embodiment, a conductive seed layer can be applied to the topside of the semiconductor wafer by means of chemical vapour deposition. In one embodiment, an alternative possibility for applying a conductive seed layer to the topside of the semiconductor wafer is physical vapour deposition. In both cases, an extremely thin layer with a thickness of a few 100 nanometers up to a few micrometers is deposited on the semiconductor wafer in order to ensure the flow of current to the contact connection surfaces for the electrodeposition.

In one embodiment, the physical vapour deposition methods include a vapor deposition technique in which the material to be deposited is melted and vapor deposited in a vacuum on to the conductor wafer. In one embodiment, instead of a vapor deposition technique, use can also frequently be made of a sputtering technique in which a sacrificial metal is atomized and precipitates on the semiconductor wafer.

In one embodiment, after the production of the seed layer, the conductive seed layer is advantageously covered with a protective layer by means of a photolithographic method while exposing the contact surface regions. In one embodiment, suitable for a photolithographic method are polyamide layers that can be structured with the aid of the photolithographic method. In one embodiment, instead of such photolithographic methods, it is also possible to use a jet printing technique to apply the protective layer while exposing contact surface regions. In one embodiment, in a way similar to the case of the inkjet printer, in this jet printing technique the surface of the semiconductor wafer is covered with a patterned protective layer.

In one embodiment, it is also possible to remove the electrically conducting seed layer before the heat treatment or before the high-temperature interval. This is particularly advantageous whenever the risk exists that the metals of the seed layer impair properties of the pattern, arranged therebelow, of the integrated circuit during the heat treatment step or the high temperature interval.

In one embodiment, the protective layer and the seed layer can be removed before the heat treatment step by plasma combustion of the protective layer, followed by plasma etching of the seed layer. These are dry etching methods that ensure that the semiconductor chips or the semiconductor wafers are handled with care.

In one embodiment, the heat treatment itself is preferably performed in an inert gas atmosphere in order to exhaust the volatile constituents, escaping during heat treatment, of the bases with external contacts and, simultaneously, to protect the surface of the bases with external contacts against oxidation or against other reactions with a reactive atmosphere.

In a further embodiment of the method, the heat treatment is performed under a reducing gas atmosphere, preferably under a forming gas. This forming gas, which consists of a mixture of nitrogen and hydrogen, has the advantage of reducing thin oxide skins of the material of the bases with external contacts that could have formed during wet etching or during subsequent purging operations. Finally, in one embodiment, it is also possible to carry out the heat treatment under a reduced gas pressure so as to improve the outward diffusion of volatile gases in that after diffusing out of the surface of the bases with external contacts the gases are exhausted relatively quickly.

In one embodiment of the method, the heat treatment is carried out at 200° C. for 2 hours under a forming gas atmosphere, and the subsequent RTP step, in which the melting temperature is exceeded, is performed at 250° C. for 30 seconds, likewise in a forming gas atmosphere for external contact materials made from an SnAg solder mixture. In one embodiment, this is followed by etching in 1% hydrofluoric acid for 60 seconds. The furnace process at 250° C. leads to an outgassing of the volatile constituents of the bases with external contacts.

At this temperature, the tin/silver structure has not yet been remelted. It is only during the subsequent high temperature interval in the form of an RTP process that the structure is remelted and a surface segregation of the solid contaminants and inclusions on the surface of the bases with external contacts takes place. In one embodiment, since the solid contaminants and inclusions are present on the surface of the bases with external contacts after conclusion of the RTP process, they can be removed there by the subsequent etching. In this case, all three successive processes are designed such that they do not attack the electronic circuit in the semiconductor chip or vary the switching behavior of the semiconductor chip.

One of the above described methods is also illustrated in FIG. 1. The method 10 for producing and cleaning bases with external contacts for surface mounting on circuit mounts comprises an electrodeposition of the bases with external contacts on semiconductor wafers or semiconductor chips at 12. The method 10 further comprises a heat treatment of the bases at temperatures below the melting temperature of a material of the bases at 14. The method 10 further comprises traversing a rapid thermal process (RTP) high-temperature interval in the case of which at least the melting temperature is reached, wherein the high-temperature interval is set to a period $t_H$ of $10\,s \leq t_H \leq 300\,s$ at 16, and there-after wet etching the surfaces of the bases with external contacts at 18. In one embodiment of the invention, the heat treatment removes volatile substances and lasts for a heat treatment period to in the range of $0.5\,h \leq t_D \leq 5.0\,h$, and the rapid thermal process is performed after the heat treatment of the bases at temperatures below the melting temperature of the material of the bases.

Figure 2:
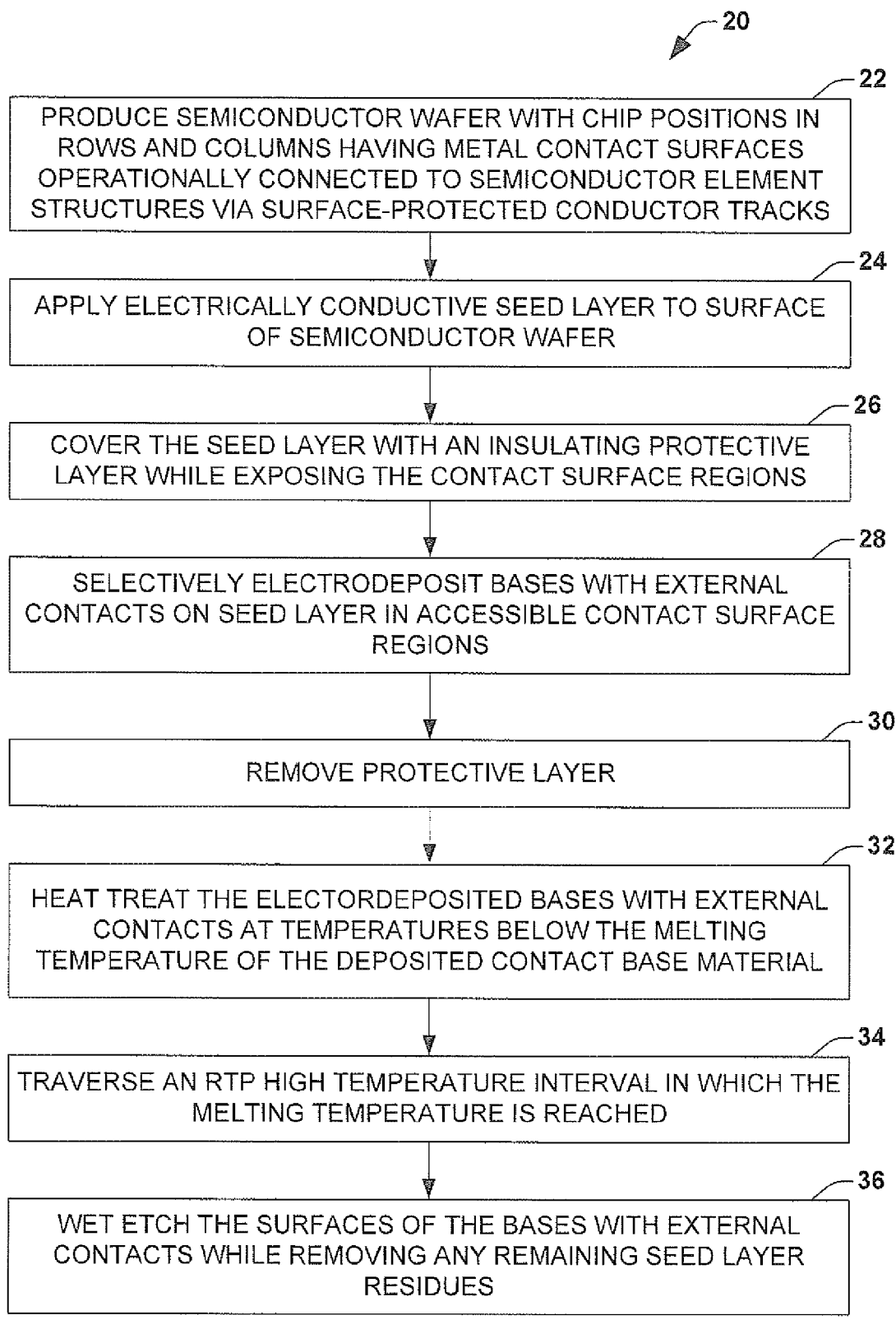

One of the above described methods is also illustrated in FIG. 2. The method 20 for producing surface-mountable semiconductor chips for circuit mounts comprises producing a semiconductor wafer with semiconductor chip positions arranged in rows and columns, the semiconductor chip positions having metal contact surfaces that are operationally connected to semiconductor element structures of the semiconductor chip positions via surface-protected conductor tracks at 22. The method 20 further comprises applying an electrically conductive seed layer to a surface of the semiconductor wafer at 24, and covering the seed layer with an insulating protective layer while exposing the contact surface regions at 26. The method 20 further comprises selectively electrodepositing bases with external contacts on the seed layer in freely accessible contact surface regions at 28, and removing the protective layer at 30. Still further, the method 20 comprises heat treating the electrodeposited bases with external contacts of the semiconductor wafer at temperatures below the melting temperature of the deposited contact base material at 32, and traversing a rapid thermal process (RTP) high-temperature interval in which the melting temperature of a material of the bases is reached at 34. There-after, the method 20 comprises wet etching the surfaces of the bases with external contacts while removing remaining seed layer residues at 36. In one embodiment of the invention, the heat treatment removes volatile substances and lasts for a heat treatment period $t_D$, in the range of $0.5\,h \leq t_D \leq 5.0\,h$, and the rapid thermal process is performed after the heat treatment of the bases at temperatures below the melting temperature of the material of the bases.

What is claimed is:

1. A method for producing and cleaning bases with external contacts for surface mounting on circuit mounts, the method comprising:

electrodeposition onto a semiconductor wafer or onto semiconductor chips of the bases with external contacts;

heat treatment of the bases at temperatures below the melting temperature of a material of the bases;

traversing a rapid thermal process (RTP) high-temperature interval during which at least the melting temperature is reached, wherein the high-temperature interval is set to a period $t_H$ of $10\,s \leq t_H \leq 300\,s$, and there-after wet etching surfaces of the bases with external contacts by introducing an etchant after the rapid thermal process; and after the wet etching is carried out, surface mounting the semiconductor chips on the circuit mounts;

wherein the heat treatment removes volatile substances and lasts for a heat treatment period $t_D$, in the range of 0.5 h$\leq t_D \leq$5.0 h, and wherein the rapid thermal process is performed after the heat treatment of the bases at temperatures below the melting temperature of the material of the bases.

2. The method according to claim 1, wherein the electrodeposition is onto the semiconductor wafer, and before the wet etching the single semiconductor wafer is separated into individual semiconductor chips.

3. The method according to claim 1, wherein the electrodeposition is onto the semiconductor wafer, and before the heat treatment the single semiconductor wafer is separated into individual semiconductor chips.

4. The method according to claim 1, wherein the bases with external contacts are heat treated at a temperature $T_T$ below the melting temperature $T_S$ of $$(T_S-50°\ C.)\leq T_T\leq(T_S-5°\ C.).$$

5. The method according to claim 1, wherein the bases with external contacts are heat treated in the high-temperature short interval up to peak temperatures $T_H$ that are at $$(T_S+5°\ C.)\leq T_H(T_S+50°\ C.)$$

relative to the melting temperature $T_S$.

6. The method according to claim 1, wherein the wet etching of the surfaces of the bases with external contacts is performed with 1% hydrofluoric acid.

7. The method according to claim 1, wherein the surfaces of the bases with external contacts are wet etched with 1% sulfuric acid.

8. The method according to claim 1 wherein a SnAg solder mixture is deposited as a material of the bases with external contacts.

9. The method according to claim 1, wherein a SnAgCu solder mixture is deposited as a material of the bases with external contacts.

10. The method according to claim 1, wherein the heat treatment is performed under an inert gas atmosphere.

11. The method according to claim 1, wherein the heat treatment is performed under a reducing gas atmosphere.

12. The method according to claim 1, wherein the heat treatment is performed under a reduced gas pressure.

13. A method for producing surface-mountable semiconductor chips for circuit mounts, the method comprising:

producing a semiconductor wafer with semiconductor chip positions arranged in rows and columns, the semiconductor chip positions having metal contact surfaces that are operationally connected to semiconductor element structures of the semiconductor chip positions via surface-protected conductor tracks applying an electrically conductive seed layer to a surface of the semiconductor wafer;

covering the seed layer with an insulating protective layer while exposing contact surface regions;

selectively electrodepositing bases with external contacts on the seed layer on the contact surface regions;

removing the protective layer;

heat treating the electrodeposited bases with external contacts of the semiconductor wafer at temperatures below a melting temperature of the deposited electrodeposited bases with external contacts;

traversing a rapid thermal process (RTP) high-temperature interval in which the melting temperature of the electrodeposited bases is reached, and there-after wet etching surfaces of the bases with external contacts while removing remaining seed layer residues by introducing the etchant after the rapid thermal process; and after the wet etching is carried out, surface mounting the semiconductor chips on circuit mounts;

wherein the heat treatment removes volatile substances and lasts for a heat treatment period $t_D$, in the range of 0.5 h$\leq t_D \leq$5.0 h, and wherein the rapid thermal process is performed after the heat treating of the bases.

14. The method according to claim 13, wherein before the wet etching, the single semiconductor wafer is separated into individual semiconductor chips.

15. The method according to claim 13, wherein before the heat treatment, the single semiconductor wafer is separated into individual semiconductor chips.

16. The method according to claim 13, wherein the bases with external contacts are heat treated at a temperature $T_T$ below the melting temperature $T_S$ of $$(T_S-50°\ C.)\leq T_T\leq(T_S-5°\ C.).$$

17. The method according to claim 13, wherein the bases with external contacts are heat treated in the rapid thermal process high-temperature interval up to peak temperatures $T_H$ that are at $$(T_S+5°\ C.)\leq T_H(T_S+50°\ C.)$$

relative to the melting temperature $T_S$.

18. The method according to claim 13, wherein a high-temperature interval is set to a period $t_H$ of $$10\ s\leq t_H\leq 300\ s.$$

19. The method according to claim 13, wherein the wet etching of the surfaces of the bases with external contacts is performed with 1% hydrofluoric acid.

20. The method according to claim 13, wherein the surfaces of the bases with external contacts are wet etched with 1% sulfuric acid.

21. The method according to claim 13, wherein a SnAg solder mixture is deposited as a material of the bases with external contacts.

22. The method according to claim 13, wherein a SnAgCu solder mixture is deposited as a material of the bases with external contacts.

23. The method according to claim 13, wherein a conductive seed layer is applied to a topside of the semiconductor wafer by means of chemical vapour deposition.

24. The method according to claim 13, wherein a conductive seed layer is applied to a topside of the semiconductor wafer by means of physical vapour deposition.

25. The method according to claim 13, wherein a conductive seed layer is applied to a topside of the semiconductor wafer by means of vapor deposition technology.

26. The method according to claim 13, wherein the conductive seed layer is covered with a protective layer while exposing the contact surface regions by means of a photolithographic method.

27. The method according to claim 13, wherein the conductive seed layer is covered with the insulating protective layer while exposing the contact surface regions by applying a structured polyamide layer.

28. The method according to claim 13, wherein the conductive seed layer is covered with the insulating protective layer while exposing the contact surface regions by jet printing a protective layer.

29. The method according to claim 13, wherein the electrically conducting seed layer is removed before the heat treatment and the rapid thermal process high-temperature interval.

30. The method according to claim 13, wherein the insulating protective layer and the seed layer are removed by subjecting the insulating protective layer to plasma combustion, and subsequently plasma etching the seed layer.

31. The method according to claim 13, wherein the heat treatment is performed under an inert gas atmosphere.

32. The method according to claim 13, wherein the heat treatment is performed under a reducing gas atmosphere.

33. The method according to claim 13, wherein the heat treatment is performed under a reduced gas pressure.

34. The method according to claim 1, wherein the range of the heat treatment period is $1.5\ h \leq t_D \leq 2.5\ h$.

35. The method according to claim 1, wherein the range of the high-temperature interval is $20\ s \leq t_H \leq 50\ s$.

36. The method according to claim 13, wherein the range of the heat treatment period is $1.5\ h \leq t_D \leq 2.5\ h$.

37. The method according to claim 18, wherein the range of the high-temperature interval is $20\ s \leq t_H \leq 50\ s$.

* * * * *